United States Patent [19]

Schachner et al.

[11] Patent Number: 4,707,384

[45] Date of Patent: Nov. 17, 1987

[54] METHOD FOR MAKING A COMPOSITE BODY COATED WITH ONE OR MORE LAYERS OF INORGANIC MATERIALS INCLUDING CVD DIAMOND

[75] Inventors: Herbert Schachner, Grand-Lancy; Heinz Tippmann, Le Lignon; Benno Lux, Scuol/Gr, all of Switzerland; Klas G. Stjernberg, Huddinge; Anders G. Thelin, Vällingby, both of Sweden

[73] Assignee: Santrade Limited, Lucerne, Switzerland

[21] Appl. No.: 747,962

[22] Filed: Jun. 24, 1985

[30] Foreign Application Priority Data

Jun. 27, 1984 [SE] Sweden ............................... 8403428

[51] Int. Cl.$^4$ ...................... C23C 16/26; C23C 16/32
[52] U.S. Cl. .................................. 427/249; 427/250; 427/255; 427/255.2; 427/255.3; 427/255.7; 427/419.7; 428/408
[58] Field of Search ............... 427/249, 250, 255, 402, 427/419.7, 255.2, 122, 255.1, 255.7, 255.3; 428/408, 457, 698, 702, 704

[56] References Cited

U.S. PATENT DOCUMENTS

| | | | |
|---|---|---|---|
| 3,714,334 | 1/1973 | Vickery | 423/446 |
| 4,225,355 | 9/1980 | Galasso et al. | 427/249 |
| 4,353,963 | 10/1982 | Lee et al. | 428/446 |
| 4,504,519 | 3/1985 | Zelez | 427/249 |

FOREIGN PATENT DOCUMENTS

| | | | |
|---|---|---|---|
| 2059371 | 12/1970 | Fed. Rep. of Germany | 427/249 |
| 2157145 | 11/1971 | Fed. Rep. of Germany | 427/249 |
| 58-981100 | 5/1983 | Japan | 427/249 |
| 58-153774 | 9/1983 | Japan | 427/249 |

OTHER PUBLICATIONS

Derjaguin et al., "Growth of Diamond Films on its Own and Foreign Surfaces", pp. 307-309.
Spitsyn et al, "Vapor Growth of Diamond on Diamond and Other Surfaces", J. of Crystal Growth, vol. 52, pp. 219-226, 1981.

Primary Examiner—Sadie L. Childs
Attorney, Agent, or Firm—Burns, Doane Swecker & Mathis

[57] ABSTRACT

A chemical vapor deposition method for the production of a composite body with one or more polycrystalline diamond layers, essentially free of intercrystalline binder phase, on a substrate of one of: (a) metalbonded hardmaterial compound; (b) ceramic material; or (c) a metal or an alloy, whereby the heated substrate is contacted with a gaseous mixture of hydrocarbon or hydrogen, which mixture has been activated by passing it over a tantalum heater heated to a temperature of 1500°–2500° C.

Also disclosed is the use of the compound body in tools subjected to mechanical operations.

15 Claims, 3 Drawing Figures

FIG. 2  1μ
FIG. 3  1μ

METHOD FOR MAKING A COMPOSITE BODY COATED WITH ONE OR MORE LAYERS OF INORGANIC MATERIALS INCLUDING CVD DIAMOND

The present invention concerns a chemical vapour deposition (CVD) method for manufacturing a diamond clad composite body by reactively depositing one or, successively, more adherent polycrystalline diamond layers substantially free from intercrystalline binders on (I) a core substrate selected from (a) metal bonded hard metallic compounds, (b) ceramic materials and (c) metals or alloys, said method involving contacting the heated core with an activated gaseous mixture of hydrocarbons and hydrogen. By the term of "reactively deposited diamond", one means diamond resulting from the thermal decomposition of carbon compounds, preferably hydrocarbons, into diamondgenerating carbon atoms preferentially from the gas phase activated in such a way as to avoid substantially the deposition of graphite carbon, said diamonds being deposited onto the substrates in the form of adherent individual crystallites or layer-like agglomerates of crystallites substantially free from intercrystalline adhesion binders. Adhesion binders are normally used for building sintered diamond powder layers, a material excluded from the present invention.

Diamond layers of the aforementioned type are known and many deposition methods have been reported including chemical vapour deposition (CVD), for instance, the use of mixtures of hydrocarbons and hydrogen, said mixtures being activated for diamond deposition by passing over a hot thermionic emitter material such as a tungsten filament.

This activation provides, in addition to carbonaceous species, atomic hydrogen which is believed to be essential for excluding the deposition of graphite carbon.

Substrates or cores onto which reactively deposited diamond layers have been applied are numerous and include for instance metals such as Mo, W, Cu, Au, Nb, Ta, Ti, Co and an alloy such as W-Co, semiconductors such as Si, diamond itself and insulators such as glassy $SiO_2$. The following references provide an illustration of the state of the art:

1. Vapour Growth of Diamond on Diamond and other Surfaces; B. V. Spitsyn et al., J. of Crystal Growth 52 (1981), 219–226.
2. Growth of Diamond Seed Crystals from the Vapour at Subatmospheric pressure; J. C. Angus et al., J. of Cryst. Growth (1968), 172.
3. Growth of Diamond Seed crystals by Vapour Deposition; J. C. Angus et al., J. Appl. Phys. 39 (6) (1968), 2915–2922.
4. Structural investigation of Thin Films of Diamond like Carbon; H. Vora at el., J. Appl. Phys. 62 (10) (1981), 6151–6156.
5. Growth of Boron-doped Diamond Seed Crystals by Vapour Deposition; D. J. Poferl et al., J. Appl. Phys. 44 (4) (1973), 1428–1434.
6. Kinetics of Carbon Deposition on Diamond Powder; S. P. Chauhan et al., J. Appl. Phys. 47 (11) (1976), 4748–4754.
7. TECHNOCRAT Vol. 15, No 5, May 1982, p. 79.
8. Diamantsynthese bei Temperaturen unter 1300° C. und Drucken unter einer Atmosphäre, R. Diehl, Z. Dt. Gemmol. Ges. 26 (1977), 128–134.
9. Color Chart for Diamond-like Carbon Films on Silicon; T. J. Moravec Thin Solid Films 70 (1980), L9–L10.
10. Japanese Pat. Application No. 56-189423 (Kokai 58-91100) Matsumoto, May 30, 1983.
11. Japanese Pat. Application No. 56-204321 (Kokai 58-110494) Matsumoto, July 1, 1983.
12. Japanese Pat. Application No. 57-12966 (Kokai 58-135117) Matsumoto, Aug. 11, 1983.
13. Growth of Diamond Films on Diamond and Foreign Surfaces; B. V. Derjaguin et al., 6. Int. Conf. for Crystal Growth, Moscow 1980, Extended Abstracts, Vol 1, p. 307–310.
14. Growth of Polycrystalline Diamond Films from the Gas Phase; V. P. Varnin et al., Kristallographia 22 (1977); Soviet. Phys. Crystallogr. 22 (4) (1977), 513–515.
15. Growth of Polycrystalline Diamond Films from the Gas Phase; Sov. Phys.-JETP, 42 (4) (1976), 839–840.
16. FR-A-1, 366, 544 (1964) SIEMENS.
17. USP-A-3, 714, 334 (1973) DIAMOND SQ. IND.

The main objects of the invention are those defined in the annexed claims.

In one embodiment (1 Ia) of the method of the invention, the base core substrate can consist of carbides, nitrides, carbonitrides, oxycarbides and borides of metals of columns 4b to 6b of the periodical table of elements as well as mixtures and solid solutions thereof bonded by iron group metals. The periodical table to which it is referred here is the table published in Handbook of Chemistry and Physics by the Chemical Rubber Publishing Co, Cleveland, Ohio.

The carbides involved in this embodiment include for instance the hexagonal carbides WC and (Mo,W)C, the cubic carbides TiC, TaC, NbC and mixtures between cubic and hexagonal carbides and also oxycarbides like Ti(O,C).

Particular examples of nitrides which can be recited are: TiN, ZrN, NbN, TaN of carbo-nitrides: Ti(C,N), (Ti,Mo)(C,N) of oxynitrides: Ti(O,N) and of oxycarbonitrides: Ti(O,C,N).

Examples of borides are: $TiB_2$, $ZrB_2$.

Iron group metals include Ni, Co and Fe.

Among the materials included in this embodiment are the cemented carbides. As general reference for substrate materials according to (1 Ia) may be cited the books:

"Hartstoffe" by R. Kieffer and F. Benesovsky, Springer-Verlag, Wien 1963; and "Hartmetalle" by R. Kieffer and F. Benesovsky Springer-Verlag, Wien 1965.

In another embodiment of the method of the invention (1 1b) the core material (1b) is selected from ceramic and refractory compounds comprising borides, carbides, nitrides and oxides of elements of columns 3a to 4a and 4b to 6b of the periodical table of elements and mixtures, solid solutions or compounds thereof.

This comprises oxides like $Al_2O_3$, $ZrO_2$, $TiO_2$, $SiO_2$; nitrides like BN, AlN, $Si_3N_4$; carbides like SiC, $B_4C$; oxinitrides like AlON or "Sialon" $Si_{6-x}Al_xO_xN_{8-x}$, a solid solution of $Al_2O_3$ and AlN in $Si_3N_4$; mixed ceramics such as $Al_2O_3$—TiC, $Al_2O_3$—TiN, $Al_2O_3$—$TiB_2$, $Al_2O_3$—TiC—TiN. Ceramics in this invention also include cermets, i.e., composites of ceramics and metals such as ceramic fiber-reinforced metals and metal-impregnated ceramics or metal-ceramic laminates.

Still in another embodiment (1 Ic) the core material (Ic) can be selected from precious metals and their alloys. Such precious metals include silver, gold, platinum, palladium, ruthenium, rhodium, osmium and iridium. The core materials can also be made of alloys of other metals than precious metals, i.e. of any two or more common metals, possibly including precious metals, providing alloys stable in air under ordinary conditions and up to about 600° C. The preferred metals for such alloys are those of columns 1b to 7b and 8 of the periodical table of elements and include for instance copper, aluminium, silicon, titanium, zirconium, vanadium, niobium, tantalum, chromium, molybdenum, tungsten, mangenese, iron, cobalt, nickel, and the like.

The materials constituting the intermediate layer or layers of the cladding deposited on the core can be selected from refractory compounds, metals and alloys.

Refractory compounds, solid solutions and mixtures thereof can be selected from borides, carbides, nitrides and oxides of elements of columns 3a to 4a and 4b to 6b of the periodical table of elements. Among these materials, the following are recited as examples $TiB_2$, $B_4C$, SiC, TiC, BN, AlN, $Si_3N_4$, $Al_2O_3$, Ti(C,N), Ti(C,O), Ti(N,O), Ti(C,N,O), AlON, "Sialon".

When the object of the invention is to prepare composites having at least two layers in the cladding one of these being diamond and the other one consisting of a non-diamond material being interposed between the substrate core and the diamond layer, the purpose of the latter is to act as a binder layer to improve the adhesion of the diamond on the substrate or to improve other important properties like wear resistance or chemical resistance of the coated body.

In some preferred embodiments, the coating material is selected from or contains metals, which are capable of forming stable carbides, for instance metals of colums 4b to 6b of the periodical table, preferably Ti. These may be applied in pure form as very thin layers or in combination with other metals which are capable of dissolving such metals and forming alloys. Metals having a high affinity to diamond because of their easy carbide formation property, ensure that the diamond layer adheres extremely well to the substrate by means of this intermediate layer, which acts as a binding layer.

The object of the invention can be implemented by depositing on a selected core (I) one layer of CVD diamond or a combination of layers of non-diamond materials and CVD diamond, when the cladding comprises more than one layer, the order in which these layers are deposited is any; it may be chosen to achieve the desired properties, as will be illustrated in the different examples.

The method of the invention involves chemical vapour deposition using a mixture of gaseous activated hydrocarbon and hydrogen which is applied over the heated core (I). The activation is achieved by passing the gas mixture over a tantalum heater, for instance a tantalum filament electrically heated to about 1500° to 2500° C., preferably 1700° to 2000° C.

The deposition of diamond in mineral substrates by the reaction of thermally decomposed hydrocarbons in the presence of hydrogen activated to the atomic state has been reported; (see for instance B. V. Spitsyn et al., J. of Crystal Growth 52, 219–26; S. Matsumoto et al., JP Kokai 58-91100). In the last of these references, a mixture of hydrocarbon and hydrogen is preheated by passing over a tungsten filament electrically heated to above 1000° C. and said preheated mixture is directed to the surface of a mineral substrate from 500° to 1300° C., whereby diamonds deposit in crystalline layer form on the surface of the substrate.

Although this method has its merits, it however, suffers from some shortcomings, for instance the diamond layer is sometimes composed of particles with irregular shape and rough surfaces. Now, for providing the surface of the present body with a diamond layer of improved quality, for instance machining efficiency, the crystals of the latter must be well developed, have smooth faces and sharp edges. This can be surprisingly achieved by using, instead of a tungsten filament, the above-mentioned tantalum filament. The reasons why a tantalum filament provides better diamond deposits than tungsten has not been fully explained at the moment.

The operating conditions suitable for obtaining diamond layers of the desired properties will now be disclosed with reference to the annexed drawing.

FIG. 1 which represents a CVD apparatus for depositing diamonds on substrates.

FIG. 2 represents the diamonds obtained according to the invention and

FIG. 3 represents comparatively diamonds deposited by a prior art method (reference 10).

Figure 1:
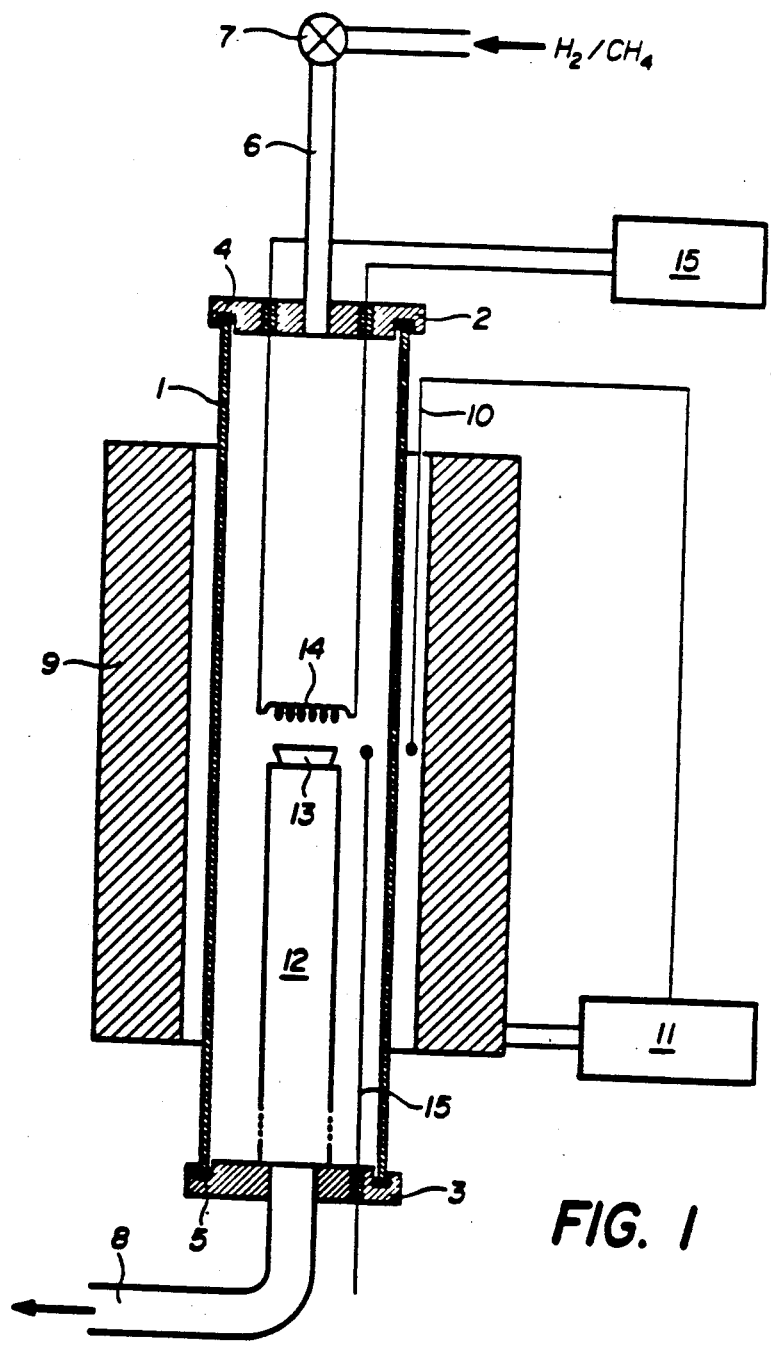

This apparatus comprises a quartz tube 1 tightly closed at the ends by covers 2 and 3 fitted with vacuum gaskets 4 and 5. The tube further comprises an inlet duct controlled by a valve 7 for introducing gases and an outlet duct 8 connected to a vacuum pump (not illustrated). The tube is surrounded by a probe 10 connected to temperature control unit 11.

Inside of the tube 1 there is a supporting silica column 12 for supporting a core substrate 13 to be coated with diamond. Above said substrate 13, there is a heater 14 of tantalum wire connected to an outside power supply 15. The tube also contains a temperature probe 16 for the substrate.

The apparatus operates as follows: after placing the substrate over the support 12, the tube 1 is evacuated by operating a vacuum pump connected to duct 8, valve 7 being closed. Then a flow of pure hydrogen is established, via valve 7 and the heating furnace is switched on to provide the desired temperature to the substrate. Then the heater 14 is energized to the desired tantalum heater temperature and a mixture of hydrogen and a hydrocarbon vapour is admitted by duct 6 at a desired ratio and pressure. This mixtures is activated by passing over heater 14. The hydrocarbon is dissociated to reactive carbon which deposits on substrate 13. In the presence of hydrogen activated on the tantalum heater, this carbon deposited as well formed polycrystalline diamond layer 0.1 to several microns thick.

The ranges of preferred operating conditions are given below:

Hydrocarbon/hydrogen mixtures: 0.2 to 10% (v:v)

The hydrocarbon can be methane or other gaseous lower alkanes.

Gas flow: 5 $cm^3$/min to 200 $cm^3$/min (standard conditions, reactor cross section 12.6 $cm^2$).

Pressure: 1 mbar to 200 mbar

Temperature of the substrate: 600°–1100° C., preferably 800° C. to 1000° C.

Temperature of the heater: 1500° C. to 2500° C., preferably 1700°–2000° C.

Under the above-mentioned operating conditions, especially depending upon the heater temperature, the diamond layer may or may not contain minute quantities of tantalum as intercrystalline inclusions.

The chemical vapour deposition method permits to incorporate various dopants or inclusions within the diamond by using additivies in the gaseous mixture. For instance, adding small amounts of diborane to the gas mixture produces boron-doped semi-conducting diamond layers. Or, by adding borazine in about 0.003% to 0.03% (v:v) to the hydrogen/hydrocarbon gaseous mixture, the polycrystalline diamond layer will include boron nitride co-deposited therein. This BN can consist of intercrystalline inclusions or be in solid solutions with the diamond. The presence of the BN will further improve some properties of the diamond containing laminated coatings of the present body.

On the other hand, it is possible to prepare diamond layers which are substantially free from impurities by using very clean gases. In this way diamonds with extremely low nitrogen content can be obtained. These have a very high thermal conductivity and in this respect, they resemble the natural type 2A diamonds.

Each individual layer of the cladding obtained from the method of the invention can be about 0.01 to about 10 μm thick, a range of 0.2 to 2 μm being preferred. However, when the cladding comprises more than one layer, its total thickness can reach 500 μm or more depending on the thickness of each layer and the number of layers. The number of layers can be two or many more and include several layers of diamond separated by non-diamond layers. The number of layers can be ten or more if desired, this number not being critical will depend on the specific applications.

The method for depositing the non-diamond layers are standard methods well known from men skilled in the art and need not be described in many details here. All information on this aspect of the present work can be found in the following references:

EP-A-83043 (METALLWERK PLANSEE); GB-A-1,425,633 (CUTANIT); US-A-3,837,896; US-A-4,284,687; GB-A-2,048,960; J. P. Chubb et al., Metals Technology, July (1980), p. 293-299.

The composite bodies resulting from the implementation of the invention have many uses in many industrial fields.

One first use is for making parts subjected to intensive wear especially tools including extrusion dyes, spalling tools, cutting and turning tools, rock drilling tools, and the like. Indeed, tools provided with inserts consisting of bodies conforming with the invention have increased resistance to abrasive wear resulting in an increased machining efficiency as well as marked increased useful life. This is particularly stringent in case the coating is provided with several diamond layers each separated by a non-diamond one, each diamond layer acting in turn when the previous one has worn off.

The following examples illustrate the invention in detail:

EXAMPLE 1

A cutting tool insert (substrate) made of cemented carbide was precoated with a layer of TiC 6 μm thick by CVD.

The coated insert was placed in a diamond coating apparatus of the kind disclosed with reference to the annexed drawing (FIG. 1). Coating was performed according to the following conditions:

Temperature of substrate 854° C.; temperature of tantalum heater 2000° C.; gas pressure 15 Torr; gas composition (v:v) 99% $H_2$-1% $CH_4$; gas flow 10 ml/min (standard conditions, diameter of reactor tube 4 cm). The coating operation was performed for 10 hours after which an adherent polycrystalline diamond layer free from any intercrystalline binder substance was obtained. The average coating thickness was about 2 μm.

The diamond layer is polycrystalline, composed of well shaped individual diamond crystals with smooth crystal faces and sharp edges, the grain size is about 1 to 3 μm (see FIG. 2).

The cutting performance of the insert obtained according to this example, for machining aluminium silicon alloys and other non-ferrous alloys as well as fibre reinforced plastics is markedly improved.

EXAMPLE 2

The conditions of Example 1 were repeated with the exception of the following: ceramics substrate, a commercial Sialon tool.

Temperature of substrate 820° C.; coating duration 6 hours.

Again a well shaped polycrystalline diamond deposit about 2 μm thick was obtained the performances of which in machining of cast iron and non-ferrous alloys is markedly improved with regard to an uncoated tool.

EXAMPLE 3

A cemented carbide tool insert is coated with a first 2 μm layer of TiC using a known CVD technique.

After the first TiC layer is deposited, the insert is introduced into the apparatus disclosed with reference to FIG. 1 and it is further coated, under the conditions described in Example 1, with a layer of polycrystalline diamond 2 μm thick.

Then a third layer of TiN, 2 μm thick is formed over the diamond layer using known physical vapour deposition techniques (PVD).

Under practical use, e.g involving the machining of silicon-carbide-containing aluminium alloys the performance of the test tool is excellent.

EXAMPLE 4

Example 3 is repeated in all details with the following exception: after the first layer of TiC (2 μm) is deposited, an intermediate about 0.1 μm thick layer of pure titanium is placed over the TiC to provide improved adhesion toward the subsequent polycrystalline diamond layer. The Ti deposition is carried out by a known PVD technique, high vacuum evaporation or sputtering.

This multilayer coating gives excellent results by decreasing the rate of tool failure in milling.

EXAMPLE 5

A drilling bit is prepared by applying on the cutting tip of a cemented carbide drill a composite coating of hard materials. The first layer of this coating is 0.5 μm of TiN deposited as in the previus examples, then the second layer is 2 μm of polycrystalline diamond also deposited as in the previous examples.

The first two layers are followed by alternating 0.5 μm TiN and 2 μm diamond layers, the total being seven of each. The total thickness of the coating is 17.5 μm. The drill thus obtained is used for drilling composites consisting of fiber reinforced plastic materials and metals. The penetration rate and the wear life are outstanding.

EXAMPLE 6

A ceramic wear-part made of alumina for use as a wire drawing die is coated with a 2.5 μum layer of polycrystalline diamond according to the invention under the conditions of Example 1 except for the following parameters: substrate temperature 815° C.; gas flow 100 ml/min (standard conditions); duration 24 hours.

EXAMPLE 7

A thread-guide made of Sialon is first coated with a layer of $Al_2O_3$ according to the known CVD technique.

After the first layer of alumina, the latter is further coated with diamond using the conditions of the previous examples; thickness 1.8 μm.

EXAMPLE 8

A Sialon insert is coated with a diamond layer containing small quantities of BN in the apparatus described with reference to FIG. 1 using the following conditions: temperature of substrate 820° C.; temperature of heater 2000° C.; gas pressure 15 Torr; gas composition in % by volume under standard conditions: $CH_4$ 1, borazine 0.003, $N_2$ 0.014, $H_2$ 98.983; gas flow 10 ml/min. A typical diamond like polycrystalline deposit is obtained.

We claim:

1. A chemical vapour deposition (CVD) method for manufacturing a diamond clad composite body by depositing one or, successively, further adherent polycrystalline diamond layers substantially free from intercrystalline binder on (I) a core substrate selected from (a) metal bonded hard metallic compounds, (b) ceramic materials and (c) metals or alloys, said method involving contacting the heated core with an activated gaseous mixture of hydrocarbon and hydrogen, characterized in that said mixture is activated by passing over a tantalum heater to a temperature of 1500° to 2500° C.

2. The method of claim 1 in which an intermediate layer IIB of a material selected from the group consisting of metals, ceramics and mixtures thereof is interposed between at least one of the core and the diamond layer and between the further diamond layers for improving physical and chemical properties.

3. The method of claim 1, wherein the core material (Ia) is selected from carbides, nitrides, carbonitrides and borides of metals of columns 4b to 6b of the periodical table of elements bonded by iron group metals.

4. The method of claim 1 wherein the core material (Ib) is selected from borides, carbides, nitrides, and oxides of elements of columns 3a to 4a and 4b to 6b of the periodical table of elements and mixtures, solid solutions and compounds thereof.

5. The method of claim 1, wherein the core material (Ic) is selected from Cu, Ag, Au, Pt, Pd, Ru, Rh, Os and/or Ir.

6. The method of claim 1, wherein the alloy material (Ic) of the core is selected from the solid mixtures of at least two metals of columns 3a to 4a, 1b to 7b and 8 of the periodical table of the elements.

7. The method of claim 2, wherein the material of the intermediate layers (IIb) is selected from borides, carbides, nitrides and oxides of elements of columns 3a to 4a and 4b to 6b of the periodical table of elements and mixtures, solid solutions or compounds thereof.

8. The method of claim 2, wherein the material of the intermediate layers (11b) although different from that of the core material, is selected from metals or alloys comprising Cu, Ag, Au, Pt, Pd, Ru, Rh, Os and/or Ir.

9. The method of claim 1, wherein the material of the intermediate layers, although different from that of the core material, is selected from stable carbide forming metals or alloys containing such metals.

10. The method of claim 1, wherein the carbide forming metals are selected from the metals of columns 4b to 6b of the periodical table of elements, preferably Ti.

11. The method of claim 1, wherein the diamond further comprises boron, nitrogen or mixtures thereof as non binder intercrystalline inclusions or dopant materials in solid solution.

12. The method of claim 1, wherein the nitrogen content of the diamond layer is below 100 ppm.

13. The method of claim 1, wherein the diamond and intermediate layers have a thickness of 0.01 to 10 microns each and the cladding has a thickness of 0.1–500 microns.

14. The method of claim 1, in which the tantalum heater temperature is 1700° to 2000° C.

15. The method of claim 11, in which the diamond layer contains BN and comprises using borazine as a further components of the gaseous mixtures.

* * * * *